United States Patent
Zumstrull

(10) Patent No.: US 6,532,942 B2
(45) Date of Patent: Mar. 18, 2003

(54) PRE-TREATMENT METHOD FOR AN ELECTROMAGNETIC TRANSDUCER

(75) Inventor: Claus Zumstrull, Regenstauf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/109,920

(22) Filed: Mar. 28, 2002

(65) Prior Publication Data

US 2002/0117153 A1 Aug. 29, 2002

Related U.S. Application Data

(63) Continuation of application No. PCT/DE00/03360, filed on Sep. 27, 2000.

(30) Foreign Application Priority Data

Sep. 29, 1999 (DE) .......................... 199 46 718

(51) Int. Cl.[7] .............................. F02M 37/04
(52) U.S. Cl. .................... 123/498; 239/102.2
(58) Field of Search .................. 123/198, 478, 123/506, 490; 239/102.2, 533.2, 585.1

(56) References Cited

U.S. PATENT DOCUMENTS

| | | | | |
|---|---|---|---|---|
| 3,589,345 A | * | 6/1971 | Benson | ........................ 123/478 |
| 4,608,958 A | * | 9/1986 | Sakakibara et al. | ......... 123/498 |
| 4,644,212 A | * | 2/1987 | Moritugu et al. | ............ 310/317 |
| 4,705,003 A | | 11/1987 | Sakakibara et al. | |
| 4,966,119 A | | 10/1990 | Mitsuyasu et al. | |

FOREIGN PATENT DOCUMENTS

| | | |
|---|---|---|
| DE | 2 235 055 | 1/1974 |
| DE | 25 20 058 | 11/1976 |
| DE | 26 37 951 | 3/1977 |
| DE | 27 40 254 | 3/1979 |
| DE | 197 56 182 A1 | 7/1999 |
| EP | 0 324 450 A2 | 7/1989 |
| GB | 2 219 145 A | 11/1989 |
| JP | 63 088 246 | 4/1988 |
| JP | 06 245 552 | 9/1994 |

* cited by examiner

*Primary Examiner*—Willis R. Wolfe
*Assistant Examiner*—Mahmoud Gimie
(74) *Attorney, Agent, or Firm*—Laurence A. Greenberg; Werner H. Stemer; Ralph E. Locher

(57) ABSTRACT

The pre-treatment method for an electromechanical transducer is particularly suitable for polarizing a piezoelectric actuator for an injection system of an internal combustion engine. Prior to the actual operation, the transducer is actuated with an electrical pre-treatment signal, in order to set a predefined operating point in accordance with the pre-treatment signal. The pre-treatment signal corresponds substantially to the electrical actuation signal during normal operation of the transducer, in order to prevent a displacement of the pre-set operating point during normal operation of the transducer.

10 Claims, 1 Drawing Sheet

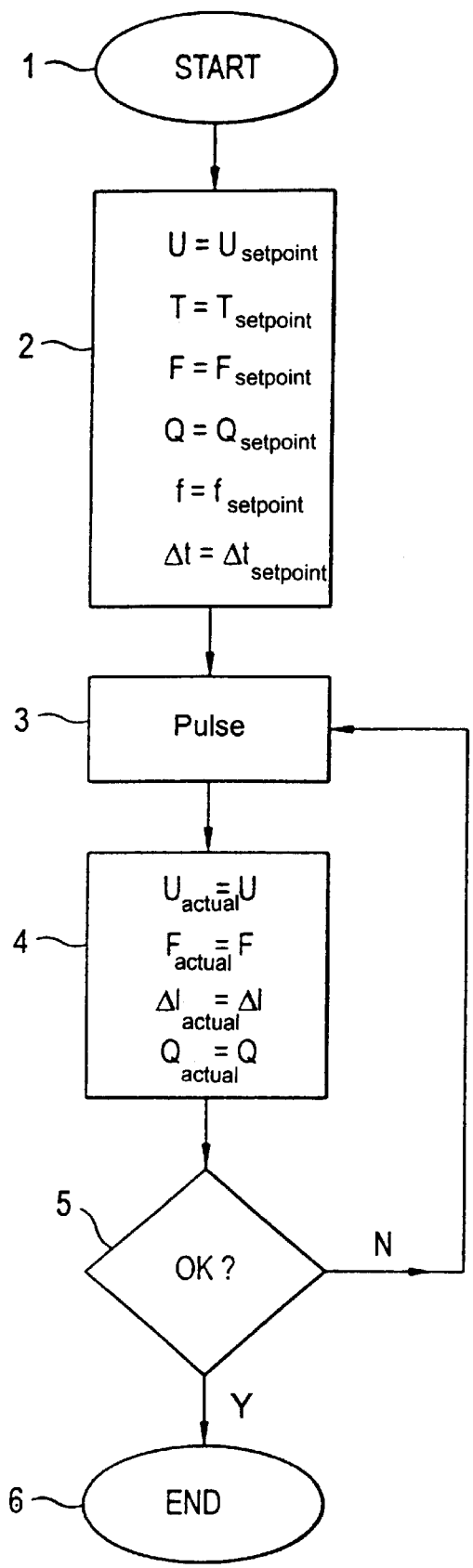

PRE-TREATMENT METHOD FOR AN ELECTROMAGNETIC TRANSDUCER

CROSS-REFERENCE TO RELATED APPLICATION

This application is a continuation of copending International Application No. PCT/DE00/03360, filed Sep. 27, 2000, which designated the United States.

BACKGROUND OF THE INVENTION

Field of the Invention

The invention relates to a pre-treatment method for an electromechanical transducer, in particular for polarizing a piezoelectric actuator for an injection system of an internal combustion engine. Prior to the actual operation, the transducer is actuated with an electrical pre-treatment signal in order to set a predefined operating point in accordance with the pre-treatment signal.

In conventional common rail injection systems for internal combustion engines, electromechanical transducers in the form of piezoelectric actuators are used for controlling the injection of fuel into the combustion chambers of the internal combustion engine in the injectors of the injection system. The piezoelectric substrate of such piezoelectric actuators usually has a multiplicity of domains which are arranged spatially distributed and which to a certain extent have different orientations. Before the actual operation, the piezoelectric actuators are therefore polarized in order to align the individual domains within the piezoelectric substrate. For this purpose, the piezoelectric substrate is subjected to an electrical signal. A disadvantage with this is that during the subsequent normal operation of the piezoelectric actuators, continuous repolarization of the piezoelectric substrate takes place, as a result of which the operating point of the piezoelectric actuators is displaced, which leads to a changed actuation behavior.

U.S. Pat. No. 4,966,119 (European published patent application EP 0 324 450 A2) discloses a pre-treatment method for a piezoelectric actuator wherein, before the actual operation, the piezoelectric actuator is actuated with two so-called dummy pulses. However, this is not a pre-treatment method according to the invention, wherein the pre-treatment of the piezoelectric actuator is carried out at the factory. In contrast thereto, the pre-treatment of the piezoelectric actuator is carried out here directly before the internal combustion engine is started.

SUMMARY OF THE INVENTION

It is accordingly an object of the invention to provide a method for pre-treating an electro-mechanical transducer, which overcomes the above-mentioned disadvantages of the heretofore-known devices and methods of this general type and wherein a piezoelectric actuator is pre-treated so that a permanent setting of a predefined operating point is reached without the operating point subsequently being displaced during normal operation of the piezoelectric actuator.

With the foregoing and other objects in view there is provided, in accordance with the invention, a pre-treatment in method for an electromechanical transducer in a piezoelectric actuator for an injection system of an internal combustion engine, which comprises the following method steps:

prior to an actual operation of the electromechanical transducer, actuating the transducer with an electrical pre-treatment signal to set a predefined operating point in accordance with the pre-treatment signal;

and thereby setting the pre-treatment signal to a pulse sequence having a pulse length in a range between 0.1 ms and 2 ms, substantially corresponding with an electrical actuation signal during normal operation of the transducer, in order to prevent a displacement of a pre-set operating point during the normal operation of the transducer.

In other words, the invention comprises the general technical teaching of defining, within the scope of the pre-treatment process occurring before the actual operation, the electrical, mechanical, thermal and/or magnetic preferential conditions which occur during the actual operation.

The electromechanical transducer is preferably actuated during the treatment process with an electrical treatment signal which corresponds essentially to the electrical actuation signal during normal operation, in order to prevent a displacement of the pre-set operating point during normal operation. For this purpose, the pre-treatment signal is preferably composed essentially of a pulse sequence, the pulse frequency preferably being essentially equal to the actuation frequency during normal operation. Customary values for the pulse frequency thus lie between 10 and 120 Hz, an actuation frequency of 55 Hz being preferred. Values in the region of between 0.1 ms and 2 ms are preferable for the pulse duration of the pre-treatment signal, a value of 1.4 ms having proven particularly advantageous for the pulse duration of the pre-treatment signal.

During the actuation with the treatment signal, the transducer is preferably additionally mechanically loaded in order to simulate the normal operating state during the pre-treatment. For this purpose, the transducer is preferably pressurized with a force of 400 N to 1000 N, a prestressing force of 850 N having proven particularly advantageous.

In accordance with an added feature of the invention, the operating temperature of the transducer is additionally simulated in that, before the actual pre-treatment, the temperature of the transducer is changed to the normal operating temperature, which is usually between +50° C. and +150° C., a value of +80° C. having proven particularly advantageous for the pre-treatment process.

In accordance with an additional feature of the invention, the response characteristics of the transducer are measured during the pre-treatment method in order to obtain information on the pre-treatment state of the transducer. The information which is acquired in this way can be used, for example, to adapt the pre-treatment parameters or to terminate the pre-treatment process after the desired state is reached. For this purpose, for example the electrical voltage, the electrical current, the travel and/or the electrical charge which has flowed through the transducer can be measured, but the invention is not restricted to the measurement of the abovementioned parameters.

In other words, the invention also comprises, during the actuation with the pre-treatment signal, measuring response characteristics of the transducer such as mechanical response characteristics and/or electrical response characteristics, to obtain information on a pre-treatment status of the transducer. Specifically, it is advantageous to measure an electrical voltage, an electrical current, a travel, and/or an electrical load that has flowed through the transducer to obtain information on the pre-treatment status. In a preferred implementation, the response characteristics of the transducer are compared with predefined reference values, and the pre-treatment process is terminated when one or more of the reference values are reached.

Other features which are considered as characteristic for the invention are set forth in the appended claims.

Although the invention is illustrated and described herein as embodied in a pre-treatment method for an electromechanical transducer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a flowchart illustrating the pre-treatment process according to the invention.

DESCRIPTION OF THE PREFERRED EMBODIMENTS

Referring now to the sole FIGURE of the drawing in detail, the flowchart illustrates the pre-treatment method according to the invention. First, after a start step 1 and in the further step 2 the pre-treatment parameters for the actual pre-treatment process are specified. The pre-treatment thus takes place in the form of polarization of the piezoelectric actuator with an electrical pulse sequence with a frequency of f=55 Hz, an actuation time of $\Delta t=1.0$ ms, a charge energy W=80 mJ, a charge time of $t_L=100\ \mu s$, and a temperature of T=+80° C. The electric actuator is pressurized with a pre-stressing force of F=850 N. After these pre-treatment parameters are prespecified, in a subsequent step 3, an electrical pulse is then transmitted to the piezoelectric actuator. In a further measuring step 4, the response characteristics of the piezoelectric actuator to the preceding pulse are then determined, wherein the voltage U, the force F, the travel $\Delta l$ and the charge Q which has flowed via the piezoelectric actuator during the pulse are measured.

Then, in an evaluation step 5 it is determined whether the pre-treatment process can be terminated. For this purpose, the measured values determined in the measuring step 4 for the piezoelectric actuator are compared with predefined setpoint values, taking into account permitted tolerance bandwidths. If the variation of the measurement values is within the tolerance bandwidths, the pre-treatment method is terminated in a terminating step 6. If, on the other hand, individual measurement parameters or a plurality thereof lie outside the tolerance bandwidths, the system returns to step 3 and a further pulse is transmitted to the piezoelectric actuator until the values measured in step 4 lie within the tolerance bandwidths.

The invention is not restricted in its embodiment to the preferred exemplary embodiments given above. Instead, a number of variants are conceivable which make use of the solution presented, even given embodiments of a fundamentally different construction.

I claim:

1. A pre-treatment method for an injection system of an internal combustion engine, which comprises the following method steps:

actuating an electromechanical transducer with an electrical pre-treatment signal to set a predefined operating point in accordance with the pre-treatment signal;

subsequently installing the electromechanical transducer into a piezoelectric actuator for the injection system of the internal combustion engine;

and thereby setting the pre-treatment signal to a pulse sequence having a pulse length in a range between 0.1 ms and 2 ms, substantially corresponding with an electrical actuation signal during normal operation of the transducer, in order to prevent a displacement of a pre-set operating point during the normal operation of the transducer.

2. The method according to claim 1, which comprises mechanically loading the transducer during the actuating step, and setting a mechanical loading to correspond substantially to a mechanical loading during normal operation of the transducer.

3. The method according to claim 2, wherein the transducer is an actuator for an injection system of an internal combustion engine, and the loading step comprises pressurizing the actuator with a force from 400 N to 1000 N during actuation with the pre-treatment signal.

4. The method according to claim 1, which comprises, prior to the step of actuating with the pre-treatment signal, changing a temperature of the transducer to a temperature corresponding substantially to an operating temperature of the transducer.

5. The method according to claim 4, which comprises, prior to the step of actuating with the pre-treatment signal, changing the temperature of the transducer to a temperature between +50° C. and 150° C.

6. The method according to claim 1, which comprises setting a pulse frequency of the pre-treatment signal to substantially correspond to an actuation frequency during normal operation of the transducer.

7. The method according to claim 1, which comprises setting a pulse frequency of the pre-treatment signal to between 10 Hz and 120 Hz.

8. The method according to claim 1, which comprises, during the actuation with the pre-treatment signal, measuring response characteristics of the transducer selected from the group consisting of mechanical response characteristics and electrical response characteristics, to obtain information on a pre-treatment status of the transducer.

9. The method according to claim 8, which comprises, during the actuation with the pre-treatment signal, measuring a parameter selected from the group consisting of an electrical voltage, an electrical current, a travel, and an electrical load that has flowed through the transducer to obtain information on the pre-treatment status.

10. The method according to claim 8, which comprises comparing the response characteristics of the transducer with predefined reference values, and terminating the pre-treatment process when one or more of the reference values are reached.

* * * * *